(12) United States Patent
Liu et al.

(10) Patent No.: US 11,837,492 B2
(45) Date of Patent: Dec. 5, 2023

(54) ELECTROSTATIC CHUCK HAVING A GAS FLOW FEATURE, AND RELATED METHODS

(71) Applicant: ENTEGRIS, INC., Billerica, MA (US)

(72) Inventors: Yan Liu, Lexington, MA (US); Jakub Rybczynski, Arlington, MA (US); Steven Donnell, Burlington, MA (US); Caleb Minsky, Medfield, MA (US); Chun Wang Chan, Somerville, MA (US)

(73) Assignee: ENTEGRIS, INC., Billerica, MA (US)

( * ) Notice: Subject to any disclaimer, the term of this patent is extended or adjusted under 35 U.S.C. 154(b) by 171 days.

(21) Appl. No.: 17/317,585

(22) Filed: May 11, 2021

(65) Prior Publication Data

US 2021/0351061 A1 Nov. 11, 2021

Related U.S. Application Data

(60) Provisional application No. 63/022,836, filed on May 11, 2020.

(51) Int. Cl.
*H01T 23/00* (2006.01)
*H01L 21/683* (2006.01)
*H01L 21/67* (2006.01)

(52) U.S. Cl.
CPC .... *H01L 21/6833* (2013.01); *H01L 21/67017* (2013.01); *H01L 21/67109* (2013.01); *H01L 21/67248* (2013.01)

(58) Field of Classification Search
None
See application file for complete search history.

(56) References Cited

U.S. PATENT DOCUMENTS

| | | | | |
|---|---|---|---|---|
| 6,108,189 | A * | 8/2000 | Weldon | C23C 16/4586 279/128 |
| 9,202,729 | B2 * | 12/2015 | Eibl | H01L 21/67248 |
| 9,613,839 | B2 * | 4/2017 | Blake | H01L 21/67248 |
| 2007/0077354 | A1 * | 4/2007 | O'Brien | H01L 21/67109 118/728 |
| 2010/0084117 | A1 * | 4/2010 | Fish | H01L 21/67109 165/80.4 |
| 2015/0348813 | A1 | 12/2015 | Mangalore | |
| 2018/0308737 | A1 | 10/2018 | Moriya | |
| 2020/0082087 | A1 | 3/2020 | Simmons | |

FOREIGN PATENT DOCUMENTS

| | | |
|---|---|---|
| KR | 19990040901 U | 12/1999 |
| KR | 20060063182 A | 6/2006 |
| KR | 20130131041 A | 12/2013 |
| KR | 20140030450 A | 3/2014 |
| KR | 20170135742 A | 12/2017 |
| TW | 200634972 A | 10/2006 |
| TW | 201027661 A | 7/2010 |

* cited by examiner

*Primary Examiner* — Stephen W Jackson (57) ABSTRACT

Described are electrostatic chucks designed for use in supporting a workpiece during a workpiece processing step, the electrostatic chuck including a gas flow system.

19 Claims, 6 Drawing Sheets

ELECTROSTATIC CHUCK HAVING A GAS FLOW FEATURE, AND RELATED METHODS

FIELD

The disclosure is in the field of electrostatic chucks used to support a workpiece during a step of processing the workpiece, the electrostatic chuck including a gas flow system.

BACKGROUND

Electrostatic chucks (also referred to simply as "chucks," for short) are used in semiconductor and microelectronic device processing. A chuck holds in place a workpiece such as a semiconductor wafer or microelectronic device substrate to perform a process on a surface of the workpiece. In particular, the electrostatic chuck secures the workpiece to an upper surface of the chuck by creating an electrostatic attractive force between the workpiece and the chuck. A voltage is applied to electrodes that are contained within the chuck, to induce charges of opposite polarities in the workpiece and the chuck.

The chuck includes various structures, devices, and designs that allow the chuck to perform, or that improve performance. Generally the chuck includes: a flat upper surface that supports a workpiece; electronic components such as electrodes, a conductive coating, and ground connections to control electrostatic charges of the chuck and a supported workpiece; and various other "devices" that may include measurement probes and moveable pins used to support or to change a position of a workpiece relative to the chuck.

An optional feature that may be included with some types of electrostatic chuck assemblies is an electrically-conductive layer at an upper surface ("substrate-support surface") of a chuck. The conductive layer contacts a bottom surface of the workpiece and thereby provides an electric connection between the workpiece and electrical ground. During processing of a workpiece, an electrostatic charge is induced in the workpiece. The charge may remain after a processing step is completed, causing a residual electrostatic attraction between the chuck and the workpiece and causing the workpiece to "stick" to the chuck after processing, at a time when the workpiece is desirably removed (e.g., lifted) from the chuck. The electrically-conductive layer can be used to dissipate a residual electrostatic charge that may accumulate in the workpiece relative to the chuck, to facilitate removal of the workpiece from the chuck.

Another typical feature of a chuck is a pattern of small protuberances that extend a very small distance above an upper surface of the chuck to support a workpiece at a small distance above the chuck surface and create space between the lower surface of the workpiece and the upper surface of the chuck.

Still another typical feature of an electrostatic chuck is a cooling system that allows a cooling gas to flow through the chuck to the upper surface of the chuck and into the space between the upper surface and a workpiece, to remove heat from the workpiece during or after a processing step. The workpiece may experience an increased temperature while being supported by the chuck in a semiconductor processing step. The cooling system and cooling gas can be useful to remove heat from the workpiece and control the temperature of the workpiece.

SUMMARY

After a step of processing a workpiece using an electrostatic chuck, the workpiece must be removed by lifting the workpiece away from the upper surface of the chuck. However, various forces may continue to act on the workpiece relative to the chuck, after completing a processing step. Electrostatic forces may continue to reside in the workpiece, causing a residual attraction of the workpiece to the chuck. Also, a pressure differential may be present between the upper surface of the workpiece and the lower surface of the workpiece. The upper workpiece surface is exposed to an interior of a processing chamber, which is typically at a near vacuum pressure (below 1 or 2 Torr). The lower surface of the workpiece is exposed to a space above the upper surface of the electrostatic chuck (sometimes referred to as a "gas flow space"), which is typically at a slightly higher pressure (e.g., up to 50 Torr) because of the presence of cooling gas contained in that space at an end of a processing step. The electrostatic forces or pressure differential may cause abrupt movement (e.g., "bouncing") of the workpiece as the workpiece is removed from the chuck, e.g., by lifting the workpiece away from the chuck.

To eliminate residual electrostatic forces between the chuck and the workpiece, an electrostatic chuck may have a charge dissipation feature that rapidly removes a residual electrostatic charge from the workpiece. This feature includes a conductive coating at the upper surface of the chuck, with a connection to electrical ground.

To reduce the effect of the pressure differential, an amount of the cooling gas contained in the space beneath the workpiece will typically be allowed to escape the gas flow space at a perimeter of the chuck, before removing the workpiece from the chuck. This process is sometimes referred to as "venting" or "bleeding out" of the residual cooling gas. A venting step occurs slowly, however, because of the very small dimensions of the gas flow space and the very low pressure differential. Current electrostatic chuck designs can require a relatively long period of time ("venting period") for the pressure differential to be substantially equalized by venting, e.g., a venting period in a range from a few to several seconds. This amount of time is considered sufficiently lengthy to affect throughput of a semiconductor manufacturing step or process by slowing down the overall process. Any significant reduction in the length of time of a venting period would be a way to improve efficiency and throughput of the process.

The Applicant has studied designs of electrostatic chucks to consider new designs that reduce the amount of time required to vent residual cooling gas from beneath a workpiece, to allow for sooner removal of the workpiece from the chuck following a processing step. The Applicant has surmised that gases contained in relatively larger open spaces below the workpiece, often located away from the perimeter of a chuck, can be very slow to escape. These larger open spaces are open portions of the chuck (a.k.a. "openings" or "passages") that accommodate any of various "devices" of an electrostatic chuck that perform an operation of the chuck during use. Examples of devices include sensors (e.g., temperature sensors, pressure sensors, other electronic sensors), vertically-moveable pins that function to raise or lower a workpiece supported by the chuck, electronic structures such as a ground connection (e.g., "ground pin"), as well as others. Each such device extends vertically through an opening in the base. The opening normally includes an open volume of space at an upper portion of the opening that is not filled by the device. A non-filled space in an opening, sometimes referred to as a "pocket," contains residual cooling gas at low pressure, after a processing step. That residual cooling gas may be slow to escape from the space beneath the workpiece during a venting step.

According to the present description, the Applicant has identified electrostatic chuck structures that include a cooling system that includes a gas flow conduit that connects with an opening in a base layer of an electrostatic chuck that contain a device of the electrostatic chuck assembly. The connection in the gas flow system between the conduit and the opening allows for improved flow of gas between the spaces of the gas flow system, including improved flow of gas during a venting step, to reduce the amount of time of a venting period.

In one aspect, the disclosure relates to an electrostatic chuck assembly. The electrostatic chuck assembly includes a base layer that includes: an upper base layer surface and a lower base layer surface, a base layer device opening that extends through the base layer and that is adapted to contain a portion of a device that performs an operation of the electrostatic chuck assembly, a gas flow conduit extending horizontally over an area of the base layer, the gas flow conduit comprising a conduit segment that connects with the base layer device opening, and a gas flow inlet that passes into the base layer and connects to the gas flow conduit.

In another aspect, the disclosure relates to a method of processing a workpiece. The method includes the use of an electrostatic chuck assembly that includes: a base layer that includes an upper base layer surface and a lower base layer surface; a base layer device opening that extends through the base layer and is adapted to contain a portion of a device that performs an operation of the electrostatic chuck assembly; a gas flow conduit extending horizontally over an area of the base, the gas flow conduit comprising a conduit segment that connects with the base layer device opening; and a gas flow inlet that passes into the base and connects to the gas flow conduit. The assembly also includes a ceramic layer disposed above the base layer. The ceramic layer includes: an upper ceramic layer surface; a lower ceramic layer surface; multiple gas flow vents extending between the lower ceramic layer surface and the upper ceramic layer surface, the vents being in fluid communication with the gas flow conduit; and a ceramic layer device opening extending through the ceramic layer, connected to the base layer device opening, and adapted to contain a portion of the device. The method further includes: supporting a workpiece on the upper ceramic layer surface and causing gas to flow into the gas flow inlet and through the gas flow conduit.

As used herein, the terms "above," "below," "top," "bottom," "upper," "lower," "vertical," and "horizontal" have meanings that are consistent with the conventional meanings of these terms, and that are consistent with the use of these terms when describing the subject matter of the included figures.

DETAILED DESCRIPTION

The following description relates to novel and inventive assemblies that are useful as an electrostatic chuck (a.k.a., a "chuck"), precursors thereof, and related methods. The novel assemblies include a novel gas flow system. The gas flow system can be used as a cooling system to remove heat from the chuck to affect or control a temperature of the chuck or of a workpiece that is supported by the chuck during or after a step of processing the workpiece.

A chuck as described can be a multi-layer structure that includes multiple different layers assembled together to form an electrostatic chuck assembly, including precursors or portions thereof. The assembly includes various features that are typical of an electrostatic chuck assembly and that allow the chuck to support a workpiece (e.g., semiconductor substrate, a microelectronic device, a semiconductor wafer, a precursor thereof) during processing, with an electrostatic attractive force holding the workpiece in place at an upper surface of the chuck. Example workpieces used with an electrostatic chuck include semiconductor wafers, flat screen displays, solar cells, reticles, photomasks, and the like. The workpiece may have an area equal to or greater than that of a circular 100 millimeter diameter wafer, a 200 millimeter diameter wafer, a 300 millimeter diameter wafer or a 450 millimeter diameter wafer.

The chuck includes an upper surface (a "workpiece-supporting surface") that is adapted to support a workpiece during processing. The upper surface typically has a circular surface area with a circular edge that defines a circular perimeter, and that also defines a diameter of both the surface and the multi-layer chuck.

The chuck also includes a number of other layers, devices, structures, or features that are required or optional for the chuck to function. These include: an electrode layer that generates an electrostatic attraction between the chuck and the workpiece to hold the workpiece in place during processing; a grounding device such as a grounding layer; measurement devices for measuring pressure, temperature, or an electrical property during a processing step; surface structures such as protuberances or a conductive surface coating; as well as others.

One layer of the multi-layer structure is a ceramic layer (a.k.a., a dielectric layer) at an upper portion of the assembly. The ceramic layer may be a top layer of the assembly and may include the upper surface of the chuck, other than a conductive coating, protuberances, or the like, that may optionally be placed on the upper surface of the ceramic layer. An electrically conductive coating at the upper surface may be connected to electrical ground through an optional grounding layer, a grounding pin, or the like, also included in the multi-layer assembly. The ceramic layer may be made of a useful ceramic material such as alumina, aluminum nitride, quartz, or $SiO_2$ (glass), among others. The ceramic layer may be made of a single (integral) layer of material, or may alternately be made of two or more different materials, e.g., multiple layers of different materials, if desired. A total thickness of a ceramic layer (having one or multiple layers of ceramic materials) may be any effective thickness, for example a thickness in a range from 1 to 10 millimeters, e.g., from 1 to 5 millimeters.

The ceramic layer is supported below by a base layer ("base" for short), which is typically made of metal, such as aluminum, aluminum alloy, titanium, stainless steel, ceramic such as alumina, a metal matrix composite, among others.

Typically between the ceramic layer and the base is one or more of: a bonding layer (e.g., a polymeric adhesive), an electrode, a grounding layer, an insulating layer that allows the electrodes and other layers to function electrically, or additional circuitry.

The assembly includes one or more devices that extend vertically relative to the assembly and that pass through openings (also referred to as "passage") that are formed vertically through one or multiple layers of the assembly. An opening through the assembly will typically include a portion that is defined by a vertical opening in the ceramic layer, an aligned portion that is defined by a vertical opening in the base, and aligned openings that pass through any other layers present between the base and the ceramic layer at the location of the device. A portion of the device (e.g., a lower portion) is contained in the portion of the opening that is defined by the opening in the base, and a portion of the device (e.g., an upper portion) is contained in the portion of the opening that is defined by the opening in the ceramic layer. The device or a portion of the device may have size and shape features to completely fill the space of the opening or a portion of the opening, e.g., the cross-sectional size and shape of the device may be the same as the size and shape of the opening. Commonly, however, the device may have a size or shape that fits within the opening while leaving some space of the opening un-filled. This space may be referred to as a "non-filled portion" of an opening, or a "pocket."

The assembly also includes a cooling system (or, more generally a "gas flow system") that circulates cooling gas through the assembly, including into thermal contact with a workpiece supported by the chuck to allow the cooling gas to remove thermal energy from the supported workpiece. A gas flow system will include a gas flow conduit that is formed in the base and that extends in horizontal directions relative to an area of the base, viewed vertically (e.g., from above, from a "top view"). The gas flow system will also include a gas flow inlet in the base that allows the cooling gas to enter the base, typically at a lower surface of the base. The gas flow inlet connects with the gas flow conduit formed in the base. With the ceramic layer disposed above the base layer, the gas flow conduit of the base connects to multiple gas flow vents that are formed in and that pass through the ceramic layer. These gas flow vents pass from a lower surface of the ceramic layer, vertically, to an upper surface of the ceramic layer to allow cooling gas to flow from the gas flow conduit of the base, through the gas flow vents, and to the upper surface of the ceramic layer.

A gas flow conduit, or portion thereof, that is part of the base may be at any useful location of the base and in any useful pattern relative to an area of the base. One example of a useful gas flow conduit may be a conduit that is formed at an upper surface of the base, e.g., in the form of a trench or "channel" formed by removing material of the base at the upper surface of the base, and having a depth that extends below the surface and into a thickness of the base. A gas flow conduit in the form of a channel is located at an upper surface of the base at the surface and to a depth below the surface. Typically, a gas flow conduit in the form of a channel can include a pattern of multiple segmented elongate three-dimensional openings or "grooves" formed in the surface by removing a small amount of material of the base, at the upper base surface, to a shallow depth.

The gas flow conduit can be formed as a pattern of multiple connected conduit segments that extend horizontally relative to a surface (viewed vertically) of the base, with the pattern being effective to distribute the cooling gas through the conduit over the area of the base, to distribute the cooling gas to gas flow vents of the ceramic layer. One example pattern of gas flow conduit segments is a "spoke-and-wheel" pattern or an approximation thereof, that includes one or more circular segments having a center at the center of the circular base and one or more generally linear or straight "spoke" segments, each of which extends between a circular segment and a location that is interior to the circular segment, i.e., to a location that is closer to the center of the base.

A channel is defined by the structure of the base at a channel bottom and channel sidewalls (either or which may be formed to be curved, straight, or otherwise shaped, in cross-section), and at an upper area by a plane of the upper base surface. When the base is assembled as a base layer of a multi-layer electrostatic chuck assembly, the upper area of the channel will be covered by a lower planar surface of an adjacent layer that is located on top of the base, for example by a lower planar surface of the ceramic layer, which may include an adhesive bonding layer. In this example of a gas flow conduit, the lower planar surface of the upper adjacent layer will define an upper area of the conduit.

The channel depth may be any that is useful to allow for a desired flow of cooling gas through the channel, for example a depth in a range from 0.5 to 2 millimeters. A width dimension of a channel may be any width that is useful to allow for a desired flow of cooling gas through the channel, for example a depth in a range from 0.5 to 2 millimeters.

Alternately, instead of a gas flow conduit in the form of a channel at a surface of the base that includes an exposed opening covered by an upper adjacent layer, a gas flow conduit may be enclosed within the base. An enclosed gas flow conduit may be otherwise similar to a gas flow channel with respect to the location (pattern) and size of the gas flow conduit, but may be located beneath the surface of the base and not at the upper surface.

Figure 1A:
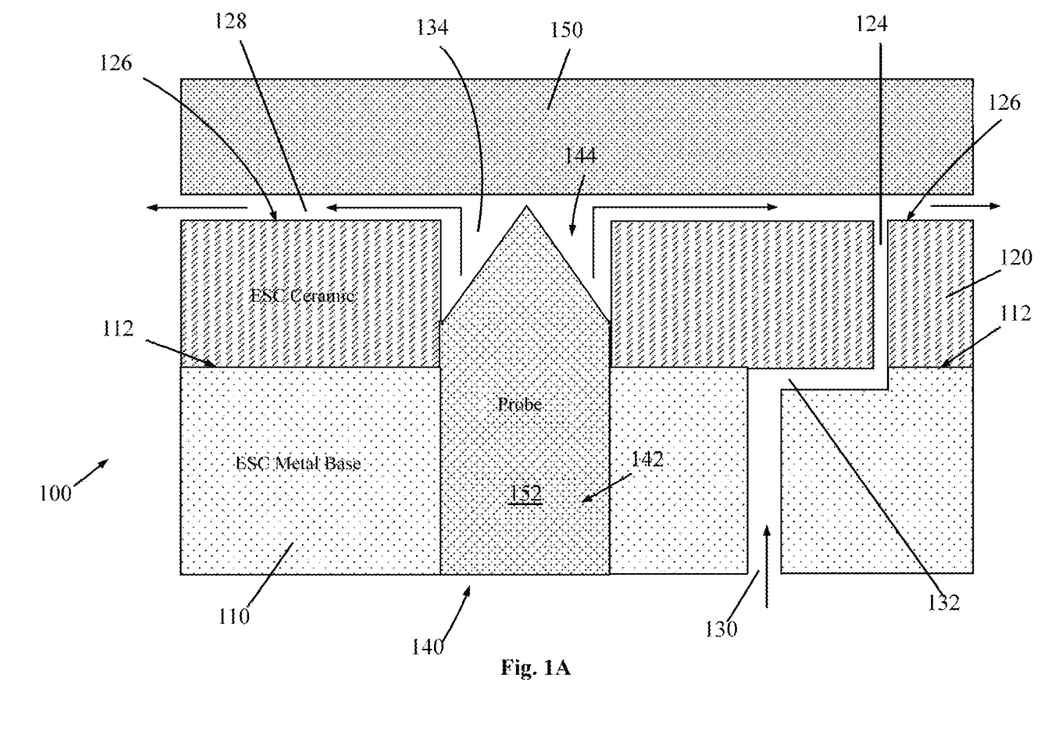
FIG. 1A is a side cut-away schematic view of a prior art electrostatic chuck assembly.
Figure 2A:
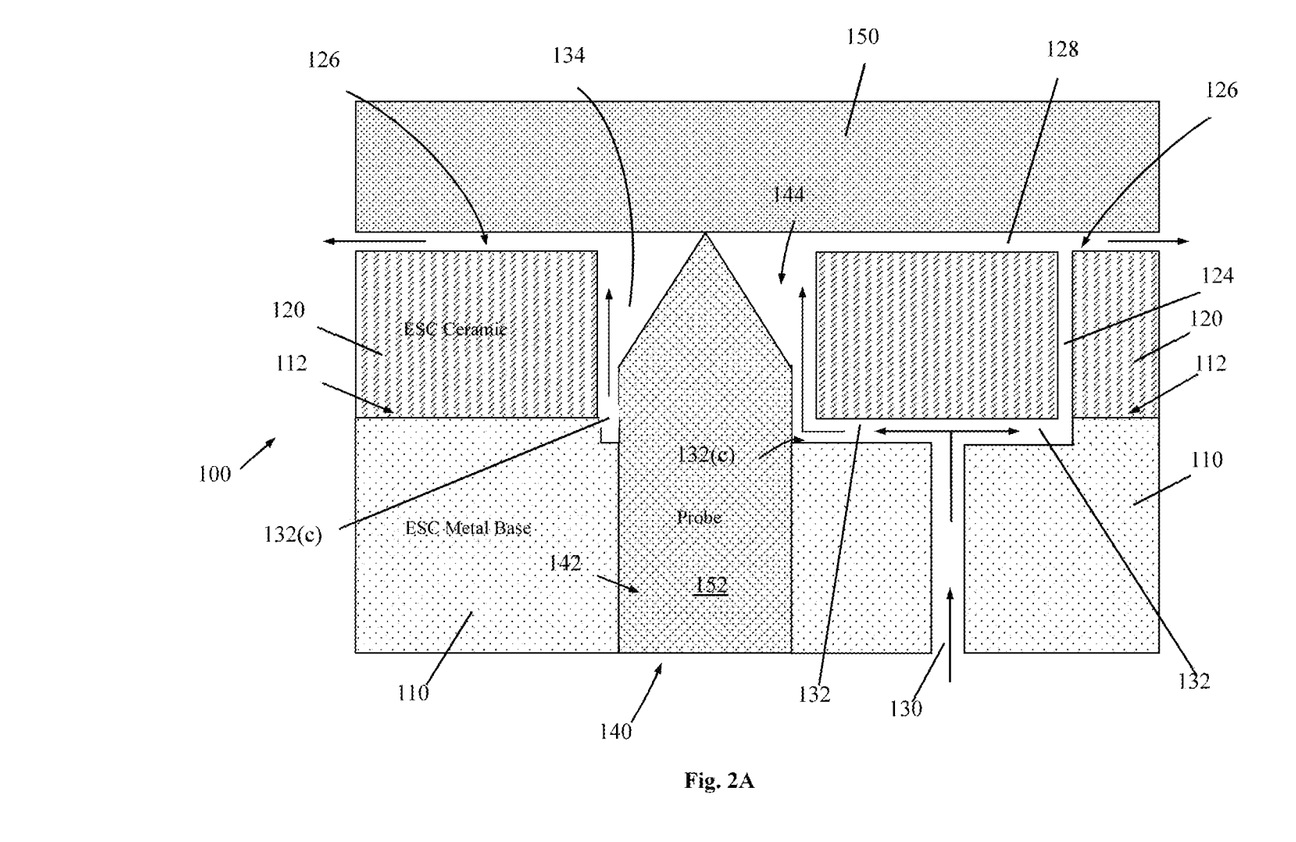
FIG. 2A is a side cut-away schematic view of an electrostatic chuck assembly of the present description.

Examples of two different multi-layer chuck assembly designs are shown schematically and in a side cross-section view at FIGS. 1A and 2A. Each assembly 100 includes horizontally extending base 110 and horizontally extending ceramic layer 120. Other optional layers or structures such as an adhesive ("bonding") layer, an electrode layer, a ground layer, a conductive coating or protuberances at an upper surface, among others, can also be included but are not illustrated.

A gas flow system extends through the assembly and includes gas flow inlet 130 connected to gas flow conduit 132, each being formed as part of base 110. Gas flow conduit 132, as illustrated, is in the form of a gas flow channel at upper surface 112 of base 110. (In alternate embodiments a gas flow conduit may be located beneath surface 112.) Gas flow conduit 132 extends horizontally over an area of base 110 and connects to vertical gas flow vents 124 formed in ceramic layer 120. Upper surface 126 of ceramic layer 120 contains protuberances (not shown) and may optionally contain other surface features such as a conductive layer (not shown) to improve performance of the chuck assembly. Workpiece (e.g., silicon wafer) 150 is supported by upper surface 126 and separated from contact with upper surface 126 by protuberances (not shown). Gas flow space 128 is located between a lower surface of wafer 150 and upper surface 126 of ceramic layer 120, and is connected to gas flow vents 124 of ceramic layer 120.

During use, cooling gas is able to enter gas flow inlet 130 from beneath base 110 and to pass through gas flow conduit 132 of base 110, then to enter vertical gas flow vents 124. The cooling gas then flows out of gas flow vents 124 into gas flow space 128 to contact workpiece 150. If desired, the cooling gas may also flow in a reverse direction.

Still referring to FIGS. 1A and 2A, device opening 140 includes lower device opening portion 142 extending vertically through base 110, and upper device opening portion 144 extending vertically through ceramic layer 120. Device 152 (as described herein) is located within opening 140. At least at an upper portion of device 152 that is located within upper device opening 144, has a shape that does not completely fill the entire volume of the passage. Open space (non-filled space or "pocket") 134 is present between opening 140 and surfaces of device 152, and below a lower surface of workpiece 150, when workpiece 150 is supported by the upper surface of assembly 100.

Figure 1B:
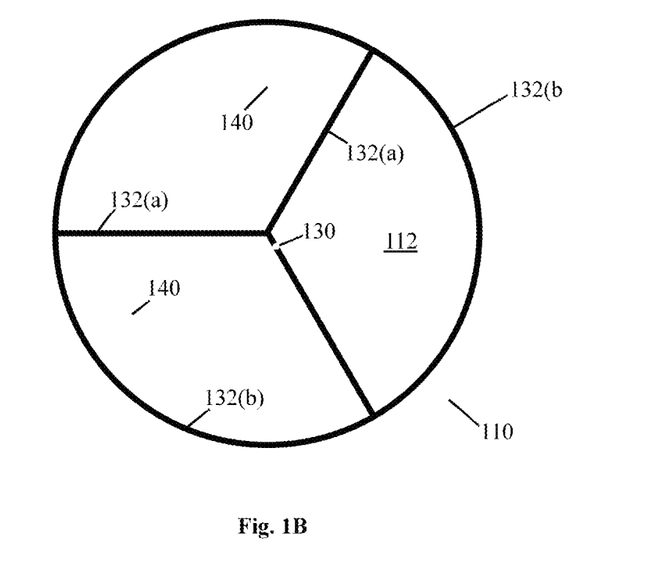
FIG. 1B is a top view of a prior art base of an electrostatic chuck assembly.

Referring specifically to FIG. 1A, assembly 100 includes pocket 134 that is isolated from, not directly connected to, gas flow conduit 132. Gas flow conduit 132 of base 110 does not connect directly to opening 140 (and pocket 134), i.e., does not connect at a location of the base. The connection between opening 140 (and pocket 134) and conduit 132 is an indirect connecting route that requires gas to flow from conduit 132, through a gas flow vent 124 of ceramic layer 120, and then through gas flow space 128 to reach opening 140. FIG. 1B, which is a top view of base 110 of assembly 100 (i.e., a top view of assembly 100 of FIG. 1A, with ceramic layer 120 and workpiece 150 removed), also shows that gas flow conduit 132 of base 110 of FIG. 1A does not connect directly to opening 140 at a location of the base. As shown at FIG. 1B, base 110 includes upper base surface 112, device opening 140 (probe 152 is not shown), and gas flow conduit 132. Gas flow conduit 132, located either at or beneath surface 112, includes multiple connected segments, including circular segment 132(b) and "spoke" segments 132(a) extending from a location generally at a center of base 110, to circular segment 132(b). Because assembly 100 of FIG. 1A does not include a direct connection between gas flow conduit 132 and opening 140, assembly 100 of FIG. 1A is not an example of an assembly or base of the present disclosure.

As mentioned hereinabove, non-filled spaces in a passage such as opening 140 of FIGS. 1A and 1B, sometimes referred to as "pockets," will contain residual cooling gas after a processing step performed with a workpiece supported by a chuck assembly. That residual gas may be slow to escape from the gas flow system during a venting step, which will result in a pressure differential across the upper and lower surfaces of the workpiece at a time when the workpiece is desirably removed from the chuck. According to example assemblies of the present disclosure, a base assembly such as assembly 100 of FIG. 2A includes a direct connection (e.g., in the form of conduit segment 132(c)) between gas flow conduit 132 of base 110 and passage 144, i.e., conduit 132 connects directly to passage 144 at a location of base 110.

Figure 2B:
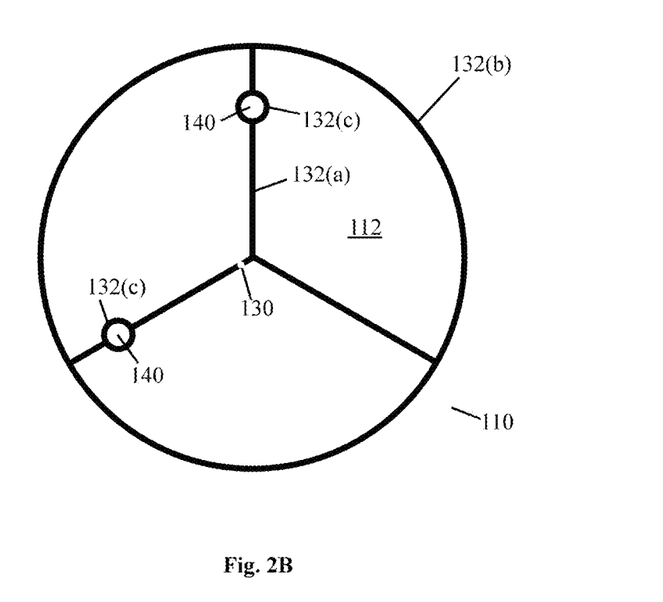
FIG. 2B is a top view of a base of an electrostatic chuck assembly as described herein.

FIG. 2B is a top view of base 110 of assembly 100 of FIG. 2A and also shows that gas flow conduit 132 of base 110 connects directly to passage 144 at a location of the base. FIG. 2B shows base 110 in the absence of workpiece 150 and ceramic layer 120. As shown at FIG. 2B, base 110 includes upper base surface 112, device openings 140 (probe 152 is not shown), and gas flow conduit 132. Gas flow conduit 132, located either at or beneath surface 112, includes multiple connected segments, including circular segment 132(b), "spoke" segments 132(a) extending from a center of an area of base 110 to circular segment 132(b), and segments 132(c) that are adjacent to and in fluid communication with one of device openings 140. As shown at FIG. 2B, gas flow inlet 130 is located within one of the spoke segments 132(a), near a center of the area of the assembly. Alternately, gas flow inlet 130 may be at a different location, as desired, such as at segment 132(c) as part of device opening 140, or as part of circular segment 132(b).

Assembly 100 of FIGS. 2A and 2B is adapted so that during use, cooling gas is able to flow directly from conduit 132 of base 120, through pocket 134, and to gas flow space 128. An improved flow of cooling gas with reduced resistance to flow through device opening 140 (including pocket 134) results, and may be generally desirable. As a more specific potential advantage, however, a gas flow conduit that allows for a flow of cooling gas directly between conduit 132 and pocket 134 also may improve venting of pocket 134, preferably reducing the amount of time needed for a step of venting residual cooling gas from a gas flow system of device 100.

Pocket 134 will contain a volume of residual cooling gas that with current electrostatic chuck assembly designs is released very slowly from gas flow space 128 during a venting step. According to the Applicant's new design, residual cooling gas that will be present in pocket 134 after a processing step may be released more rapidly from a gas flow system of a chuck, through conduit 132 and inlet 130. In addition to or instead of the residual gas flowing only through gas flow space 128 during a venting step (to eventually be released from a perimeter of assembly 100), residual cooling gas may alternately or additionally flow through conduit 132 and exit base 110 by passing through gas flow inlet 130 (which now functions as a gas flow outlet). As a result, a venting period can be reduced relative to a venting period that is needed when using a chuck that includes an alternate gas flow system or conduit design, specifically, when using a chuck that includes a gas flow system design that does not include a conduit segment that connects directly to a device opening as shown at FIGS. 2A, 2B, 3A, 3B, and 3C.

A chuck assembly as described may be used in equipment and processes useful for processing a workpiece using any of various known processing steps that involve the use of an electrostatic chuck. The described chuck and related methods may be particularly useful for semiconductor wafer processing, but may also be used for other processes. Examples of equipment and systems with which an electrostatic chuck may be used include: beam line ion implanters, plasma doping ion implanters, plasma immersion ion implantation systems, flood ion implanters, focused plasma systems, systems that modulate a plasma sheath, etching systems, optical based processing systems, and chemical vapor deposition systems. The various electrostatic chuck assemblies described herein are configured to operate with an applied voltage source (AC or DC) in an electrostatic chuck system environment as part of a wafer processing system.

Figure 3A:
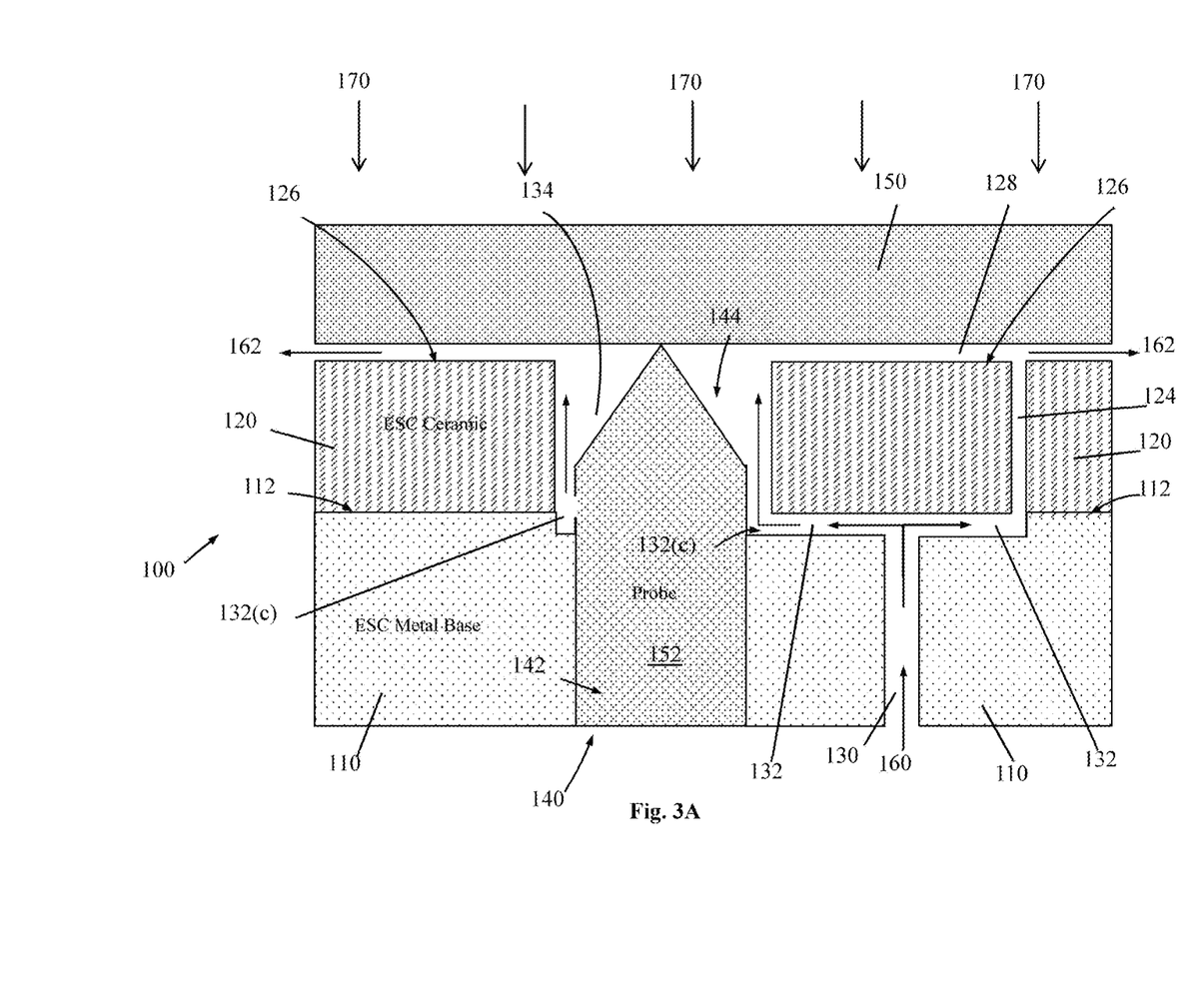
FIGS. 3A, 3B, and 3C show example steps of a method as described.

According to example methods of using a system or equipment that contains an electrostatic chuck assembly as described, a workpiece such as a semiconductor wafer is supported on the upper surface of the electrostatic chuck. An electrode of the chuck assembly is charged to produce an electrostatic attraction between the chuck and the workpiece. Referring to FIG. 3A (with numerical designations the same as in FIG. 2A), example chuck assembly 100 includes an electrode (not shown) that is activated to attract workpiece 150 to the upper chuck surface. A process is performed on workpiece 150, such as a step of accelerating particles or ions 170 (e.g., for ion implantation) toward an upper surface of workpiece 150. To allow efficient implantation or another type of process, the space within the processing chamber that contains chuck 100 and workpiece 150 may be at vacuum pressure. For example, the pressure on the upper surface of workpiece 150 may be below 5, 3, 2, or 1 Torr.

The processing step causes an increase in a temperature of workpiece 150. To remove heat from workpiece 150, cooling gas 160 is caused to flow into gas flow inlet 130. Cooling gas 160 passes through conduit 132 leading to vents 124 and, separately, to pocket 134. Cooling gas 160 then flows through vents 124 and through pocket 134, into gas flow space 128, to contact a lower surface of workpiece 150. Cooling gas 160 may be any useful gas, such as air, nitrogen, argon, or another inert gas. The pressure and rate of flow of the cooling gas may be effective to control the temperature of workpiece 150 at a desired level. A temperature of a workpiece may be dependent on factors that include the type of workpiece and the type of process being performed on the workpiece. Generally, various workpieces may be processed to various manufacturing steps at temperatures that may range from −100 to 600 degrees Celsius. Certain types of processes performed on specific substrates may be performed over a narrower range of temperatures. For example, a process of ion implantation of a semiconductor wafer may be performed on a workpiece having temperature in a range from −30 to 100 degrees Celsius.

Example pressures of cooling gas 160 in gas flow space 128 may be in a range from 5 to 50 Torr, e.g., from 10 to 30 Torr. After passing through gas flow space 128, cooling gas 160 escapes at a perimeter of assembly 100, as indicated by arrows 162.

Figure 3B:
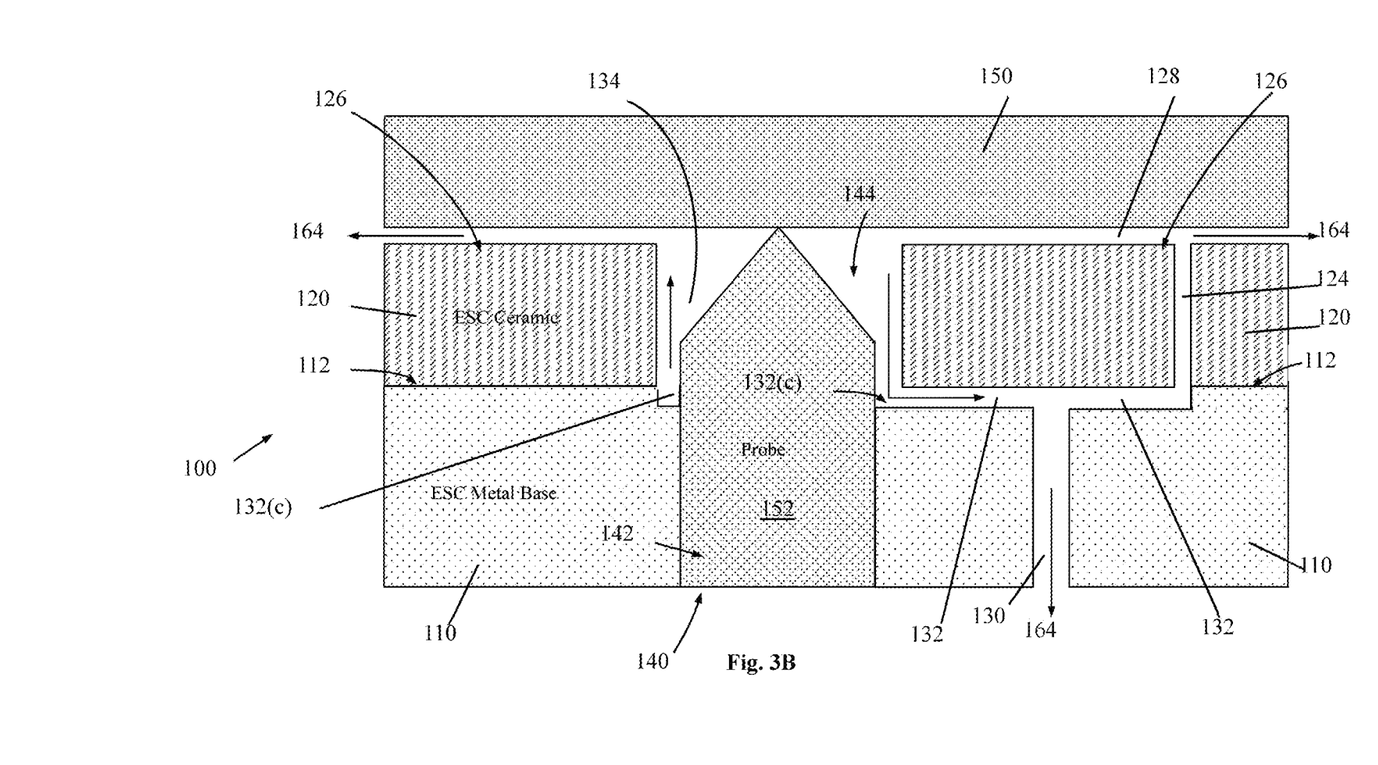

After the processing step is complete and the flow of accelerated particles or ions 170 is stopped, see FIG. 3B, the flow of cooling gas 160 is also stopped. A residual amount of cooling gas 160 remains in the gas flow system, including at gas flow space 128, pocket 134, conduit 132, and inlet 130, at a pressure up to about 50 Torr, while a residual electrostatic charge continues to attract workpiece 150 toward chuck assembly 100. An eventual step is to remove workpiece 150 from chuck assembly 100. But before removing workpiece 150, an amount of time is allowed for cooling gas 160 to escape from gas flow space 128, pocket 134, conduit 132, and inlet 130. According to the assembly design of FIGS. 3A, 3B, and 3C (as well as 2A and 2B), cooling gas 160 may escape from pocket 134 at the perimeter of assembly 100, as shown by arrows 162, and also may escape directly through conduit 132 into inlet 130. The amount of residual cooling gas 160 may escape more quickly by passing through segment 132(c) of gas flow conduit 132, as compared to a design that does not include a segment 132(c) that connects pocket 134 directly to conduit 132.

Figure 3C:
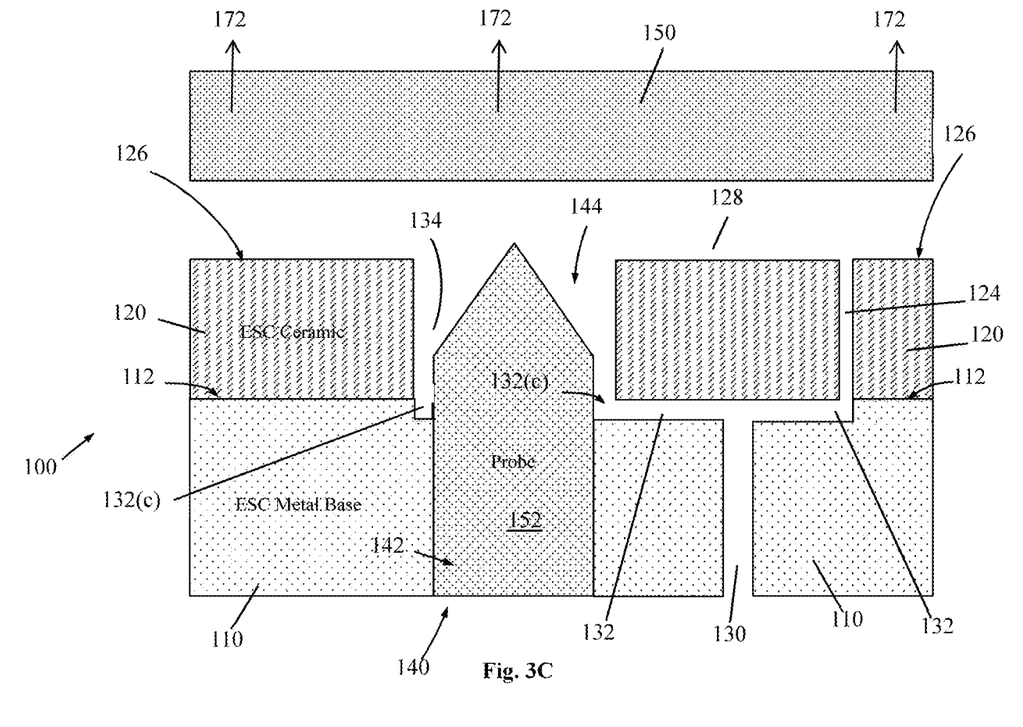

After a desired amount of time to allow an amount of cooling gas 160 to escape the gas flow system of assembly 100, workpiece 150 may be removed from, e.g., lifted up and away from, assembly 100, as shown by arrows 172 at FIG. 3C.

In a first aspect, an electrostatic chuck assembly comprises: a base layer that includes: an upper base layer surface and a lower base layer surface; a base layer device opening that extends through the base layer and that is adapted to contain a portion of a device that performs an operation of the electrostatic chuck assembly; a gas flow conduit extending horizontally over an area of the base layer, the gas flow conduit comprising a conduit segment that connects with the base layer device opening; and a gas flow inlet passing into the base layer and connected to the gas flow conduit.

A second aspect according to the first aspect wherein the gas flow conduit comprises a channel at an upper surface of the base layer.

A third aspect according to any preceding aspect further comprises a ceramic layer disposed above the base layer, the ceramic layer comprising: an upper ceramic layer surface; a lower ceramic layer surface; multiple gas flow vents extending between the lower ceramic layer surface and the upper ceramic layer surface, the gas flow vents being in fluid communication with the gas flow conduit; and a ceramic layer device opening extending through the ceramic layer, connected to the base layer device opening, and adapted to contain a portion of the device.

A fourth aspect according to any preceding aspect, further comprises embossments on the upper ceramic layer surface adapted to support a workpiece above the upper ceramic layer surface and form a gas flow layer between a lower surface of the workpiece and the upper ceramic layer surface.

A fifth aspect according to any preceding aspect, wherein the gas flow conduit comprises a circular conduit segment and multiple radial conduit segments connected to the circular conduit segment.

A sixth aspect according to any preceding aspect, wherein the device is adapted to perform a movement, affect a condition, or perform a measurement.

A seventh aspect according to any preceding aspect, wherein the device is a measurement device.

An eighth aspect according to any of the first through sixth aspects, wherein the device is a moveable probe.

A ninth aspect according to any preceding aspect, wherein: the gas flow conduit comprises a circular conduit segment and multiple radial conduit segments connected to the circular conduit segment, the base layer includes at least two base layer device openings through the base layer and each base layer device opening contains a moveable probe, and each of the at least two radial conduit segments connects to one of the base layer device openings.

A tenth aspect according to any preceding aspect, wherein the gas flow conduit comprises a gas flow conduit segment that extends around a perimeter of the base layer device opening.

In an eleventh aspect, a method of processing a workpiece comprises: supporting a workpiece on an electrostatic chuck assembly comprising: a base layer that includes: an upper base layer surface and a lower base layer surface, a base layer device opening that extends through the base layer and is adapted to contain a portion of a device that performs an operation of the electrostatic chuck assembly, a gas flow conduit extending horizontally over an area of the base, the gas flow conduit comprising a conduit segment that connects with the base layer device opening, a gas flow inlet passing into the base and connected to the gas flow conduit; and a ceramic layer disposed above the base layer, the ceramic layer comprising: an upper ceramic layer surface, a lower ceramic layer surface, and multiple gas flow vents extending between the lower ceramic layer surface and the upper ceramic layer surface, the vents being in fluid communication with the gas flow conduit, and a ceramic layer device opening extending through the ceramic layer, connected to the base layer device opening, and adapted to contain a portion of the device, wherein the workpiece is supported on the upper ceramic layer surface; and causing gas to flow into the gas flow inlet and through the gas flow conduit.

A twelfth aspect according to the eleventh aspect, wherein the electrostatic chuck comprises an electrode and the method comprises producing an electrical charge on the workpiece, and an opposite electrical charge on the electrode, to cause the workpiece to be electrostatically attracted to the electrostatic chuck assembly.

A thirteenth aspect according to the eleventh or twelfth aspect, further comprises accelerating ions toward the workpiece to cause implantation of the ions at a surface of the workpiece.

A fourteenth aspect according to any of the eleventh through thirteenth aspects, further comprises maintaining a temperature of the workpiece in a range from −30 to 100 degrees Celsius.

A fifteenth aspect according to any of the eleventh through fourteenth aspects, further comprises: stopping the flow of gas into the gas flow inlet, allowing residual gas within the gas flow conduit to vent from the gas flow conduit for a venting period, and after the venting period, removing the workpiece from the upper ceramic layer surface.

A sixteenth aspect according to the fifteenth aspect, wherein the venting period is less than 2 seconds.

The invention claimed is:

1. An electrostatic chuck assembly comprising:
   a base layer that includes:
      an upper base layer surface and a lower base layer surface;
   a base layer device opening that extends through the base layer and that is adapted to contain a portion of a device that performs an operation of the electrostatic chuck assembly;
   a gas flow conduit extending horizontally over an area of the base layer, the gas flow conduit comprising a conduit segment that connects with the base layer device opening; and
   a gas flow inlet passing into the base layer and connected to the gas flow conduit,
   further comprising embossments on the upper ceramic layer surface adapted to support a workpiece above the upper ceramic layer surface and form a gas flow layer between a lower surface of the workpiece and the upper ceramic layer surface.

2. The electrostatic chuck assembly of claim 1, wherein the gas flow conduit comprises a channel at an upper surface of the base layer.

3. The electrostatic chuck assembly of claim 1, further comprising a ceramic layer disposed above the base layer, the ceramic layer comprising:
   an upper ceramic layer surface;
   a lower ceramic layer surface;
   multiple gas flow vents extending between the lower ceramic layer surface and the upper ceramic layer surface, the gas flow vents being in fluid communication with the gas flow conduit; and
   a ceramic layer device opening extending through the ceramic layer, connected to the base layer device opening, and adapted to contain a portion of the device.

4. The electrostatic chuck assembly of claim 1, wherein the gas flow conduit comprises a circular conduit segment and multiple radial conduit segments connected to the circular conduit segment.

5. The electrostatic chuck assembly of claim 1, wherein the device is adapted to perform a movement, affect a condition, or perform a measurement.

6. The electrostatic chuck assembly of claim 1, wherein the device is a measurement device.

7. The electrostatic chuck assembly of claim 1, wherein the device is a moveable probe.

8. The electrostatic chuck assembly of claim 1, wherein:
   the gas flow conduit comprises a circular conduit segment and multiple radial conduit segments connected to the circular conduit segment,
   the base layer includes at least two base layer device openings through the base layer and each base layer device opening contains a moveable probe, and
   each of the at least two radial conduit segments connects to one of the base layer device openings.

9. The electrostatic chuck assembly of claim 1, wherein the gas flow conduit comprises a gas flow conduit segment that extends around a perimeter of the base layer device opening.

10. A method of processing a workpiece, the method comprising:
    supporting a workpiece on an electrostatic chuck assembly comprising:
       a base layer that includes:
          an upper base layer surface and a lower base layer surface,
          a base layer device opening that extends through the base layer and is adapted to contain a portion of a device that performs an operation of the electrostatic chuck assembly,
          a gas flow conduit extending horizontally over an area of the base, the gas flow conduit comprising a conduit segment that connects with the base layer device opening,
          a gas flow inlet passing into the base and connected to the gas flow conduit; and
       a ceramic layer disposed above the base layer, the ceramic layer comprising:
          an upper ceramic layer surface,
          a lower ceramic layer surface, and
          multiple gas flow vents extending between the lower ceramic layer surface and the upper ceramic layer surface, the vents being in fluid communication with the gas flow conduit, and
          a ceramic layer device opening extending through the ceramic layer, connected to the base layer device opening, and adapted to contain a portion of the device,
    wherein the workpiece is supported on the upper ceramic layer surface; and
    causing gas to flow into the gas flow inlet and through the gas flow conduit, and
       further comprising maintaining a temperature of the workpiece in a range from −30 to 100 degrees Celsius.

11. The method of claim 10, wherein the electrostatic chuck comprises an electrode and the method comprises producing an electrical charge on the workpiece, and an opposite electrical charge on the electrode, to cause the workpiece to be electrostatically attracted to the electrostatic chuck assembly.

12. The method of claim 10, further comprising accelerating ions toward the workpiece to cause implantation of the ions at a surface of the workpiece.

13. The method of claim 10, further comprising
    stopping the flow of gas into the gas flow inlet,
    allowing residual gas within the gas flow conduit to vent from the gas flow conduit for a venting period, and
    after the venting period, removing the workpiece from the upper ceramic layer surface.

14. The method of claim 13, wherein the venting period is less than 2 seconds.

15. An electrostatic chuck assembly comprising:
    a base layer that includes:
    an upper base layer surface and a lower base layer surface;

a base layer device opening that extends through the base layer and that is adapted to contain a portion of a device that performs an operation of the electrostatic chuck assembly;

a gas flow conduit extending horizontally over an area of the base layer, the gas flow conduit comprising a conduit segment that connects with the base layer device opening; and a gas flow inlet passing into the base layer and connected to the gas flow conduit, wherein the gas flow conduit comprises a gas flow conduit segment that extends around a perimeter of the base layer device opening.

16. The electrostatic chuck assembly of claim 15, wherein the gas flow conduit comprises a circular conduit segment and multiple radial conduit segments connected to the circular conduit segment.

17. The electrostatic chuck assembly of claim 15, wherein the device is adapted to perform a movement, affect a condition, or perform a measurement.

18. The electrostatic chuck assembly of claim 15, wherein the device is a measurement device.

19. The electrostatic chuck assembly of claim 15, wherein the device is a moveable probe.

\* \* \* \* \*